US010935569B2

(12) United States Patent
Golden et al.

(10) Patent No.: US 10,935,569 B2
(45) Date of Patent: Mar. 2, 2021

(54) APPARATUS AND METHOD FOR PACKAGING, HANDLING OR TESTING OF SENSORS

(71) Applicant: Rosemount Aerospace Inc., Burnsville, MN (US)

(72) Inventors: Jim Golden, Afton, MN (US); David P. Potasek, Lakeville, MN (US); Marcus Allen Childress, Farmington, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 16/251,421

(22) Filed: Jan. 18, 2019

(65) Prior Publication Data
US 2019/0154729 A1   May 23, 2019

Related U.S. Application Data

(62) Division of application No. 15/489,166, filed on Apr. 17, 2017, now Pat. No. 10,782,315.

(51) Int. Cl.
| G01R 31/00 | (2006.01) |
| G01L 1/00 | (2006.01) |
| G01R 1/04 | (2006.01) |
| B81C 99/00 | (2010.01) |
| G01R 31/28 | (2006.01) |

(52) U.S. Cl.
CPC .......... *G01R 1/0416* (2013.01); *B81C 99/004* (2013.01); *B81C 99/005* (2013.01); *G01R 31/2808* (2013.01); *G01R 31/2829* (2013.01); *B81B 2201/0264* (2013.01)

(58) Field of Classification Search
CPC ... G01L 9/0052; G01L 9/0072; G01L 9/0042; G01L 19/146; G01L 19/147; G01L 19/0618; G01L 19/0645; B81C 99/004; B81C 99/005
See application file for complete search history.

(56) References Cited

U.S. PATENT DOCUMENTS

| 5,181,417 A | 1/1993 | Nishida et al. |
| 5,285,690 A | 2/1994 | Koen et al. |
| 5,310,856 A * | 5/1994 | Li .................. C09D 179/08 528/170 |

(Continued)

FOREIGN PATENT DOCUMENTS

DE        29622830 U1    10/1997

OTHER PUBLICATIONS

U.S. Non-Final Office Action for U.S. Appl. No. 15/489,166, dated Jan. 24, 2019, 17 pages.

(Continued)

*Primary Examiner* — Minh N Tang
(74) *Attorney, Agent, or Firm* — Kinney & Lange, P.A.

(57) ABSTRACT

A method of testing sensors includes providing a test sheet that includes a plurality of sensor assemblies, a plurality of test pads, and traces extending from the sensor assemblies to the plurality of test pads. A sensor is positioned on each sensor assembly. Each sensor is connected to the sensor assembly with wire bonds. An enclosure is formed over the plurality of sensor assemblies. An electrical signal is detected from each of the plurality of sensor assemblies at the test pads.

10 Claims, 5 Drawing Sheets

(56) References Cited

U.S. PATENT DOCUMENTS

| | | | |
|---|---|---|---|
| 6,023,978 | A | 2/2000 | Dauenhauer et al. |
| 6,953,985 | B2 | 10/2005 | Lin et al. |
| 7,202,552 | B2 | 4/2007 | Zhe et al. |
| 8,884,639 | B2 | 11/2014 | Anderson et al. |
| 9,360,318 | B1 | 6/2016 | Pun et al. |
| 9,410,799 | B2 | 8/2016 | Sherrer |
| 10,021,789 | B2 * | 7/2018 | Ochi .................. C23C 18/32 |
| 2007/0289384 | A1 | 12/2007 | Sakai et al. |
| 2014/0291677 | A1 | 10/2014 | Le Neel et al. |
| 2015/0009549 | A1 | 1/2015 | Khechana et al. |
| 2015/0075844 | A1 | 3/2015 | Kim et al. |
| 2015/0362394 | A1 | 12/2015 | Shimoyama et al. |
| 2016/0029999 | A1 | 2/2016 | Corl |
| 2016/0107887 | A1 | 4/2016 | Debeurre et al. |
| 2016/0214857 | A1 | 7/2016 | Lin et al. |

OTHER PUBLICATIONS

Partial European Search Report for European Patent Application No. 18167588.5, dated Aug. 13, 2018, 10 pages.

Extended European Search Report for European Patent Application No. 18167588.5, dated Dec. 12, 2018, 10 pages.

U.S. Non-Final Office Action for U.S. Appl. No. 15/489,166, dated Nov. 19, 2019, 9 pages.

Final Office Action for U.S. Appl. No. 15/489,166 dated Feb. 28, 2020, 6 pages.

Damalerio Ramona et al.: "Ultra slim packaging and assembly method for 360-[mu]m diameter guide wires", 2015 IEEE 17th Electronics Packaging and Technology Conference (EPTC), IEEE, Dec. 2, 2015, pp. 1-4, XP032988299, DOI 10.1109/EPTC.2015.7727915.

Communication pursuant to Article 94(3) EPC for European Patent Application No. 18167588.5, dated Jul. 6, 2020.

* cited by examiner

US 10,935,569 B2

APPARATUS AND METHOD FOR PACKAGING, HANDLING OR TESTING OF SENSORS

CROSS-REFERENCE TO RELATED APPLICATION(S)

This application is a divisional of U.S. application Ser. No. 15/489,166 filed Apr. 17, 2017 for "APPARATUS AND METHOD FOR PACKAGING, HANDLING OR TESTING OF SENSORS" by Jim Golden, David P. Potasek, and Marcus Allen Childress, the disclosure of which is incorporated by reference in its entirety.

BACKGROUND

The present invention relates to packaging, handling or testing of sensors, and in particular, to packaging, handling or testing of sensors that are MEMS devices.

Guide wires can be inserted into vessels in the body and can be moved through the vessel. Guide wires are frequently used during angioplasty and act as a guide along which a catheter can move through the vessel. The catheter can carry balloons or stents that can be expanded in the vessel to widen stenosis in the vessel to allow blood to better flow through the vessel. To determine the level of stenosis present in the vessel prior to delivering a catheter to the area, the pressure can be measured both proximal to and distal of the stenosis and compared to determine the level of occlusion present. Knowing the level of occlusion present in the vessel provides information which can be used to determine appropriate action.

Pressure sensors can be positioned near a distal end of a guide wire to measure the pressure adjacent the stenosis. Pressure sensors that are positioned in guide wires are microelectromechanical systems (MEMS) devices, as they need to be very small in order to fit within a guide wire. MEMS devices typically range in size from twenty micrometers to one millimeter. Due to the small size of MEMS devices, it can be labor intensive and difficult to package, handle or test MEMS devices.

SUMMARY

A method of testing sensors includes providing a test sheet that includes a plurality of sensor assemblies, a plurality of test pads, and traces extending from the sensor assemblies to the plurality of test pads. A sensor is positioned on each sensor assembly. Each sensor is connected to the sensor assembly with wire bonds. An enclosure is formed over the plurality of sensor assemblies. An electrical signal is detected from each of the plurality of sensor assemblies at the test pads.

A sensor assembly includes a flexible circuit and a sensor positioned on the flexible circuit. The flexible circuit includes a flexible substrate that forms a body portion of the sensor assembly and pads positioned on the flexible circuit. Wire bonds connect the sensor to the pads on the flexible circuit.

A test sheet includes an array of sensor assembly dies, a plurality of test pads, and a plurality of electrical traces. Each sensor assembly die includes a sensor assembly, a frame surrounding the sensor assembly, and a plurality of tabs connecting the sensor assembly to the frame. Each electrical trace connects a sensor assembly to one test pad.

DETAILED DESCRIPTION

Figure 1:
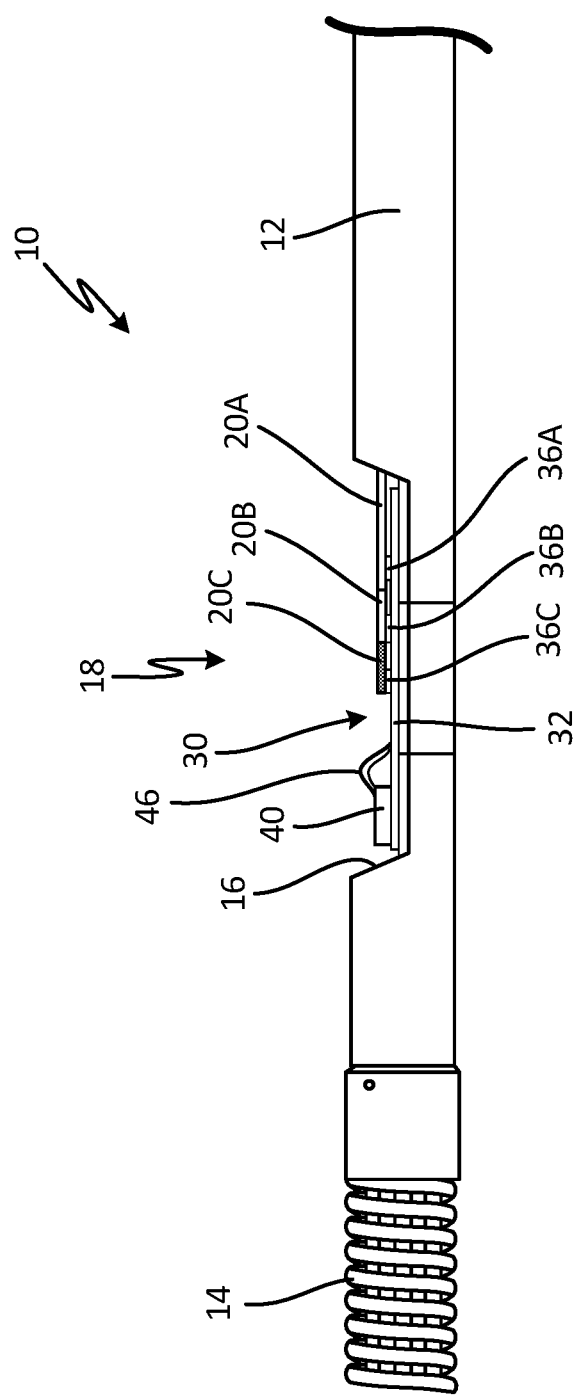
FIG. 1 is a side view of a distal portion of a guide wire, which includes a sensor assembly.
Figure 2:
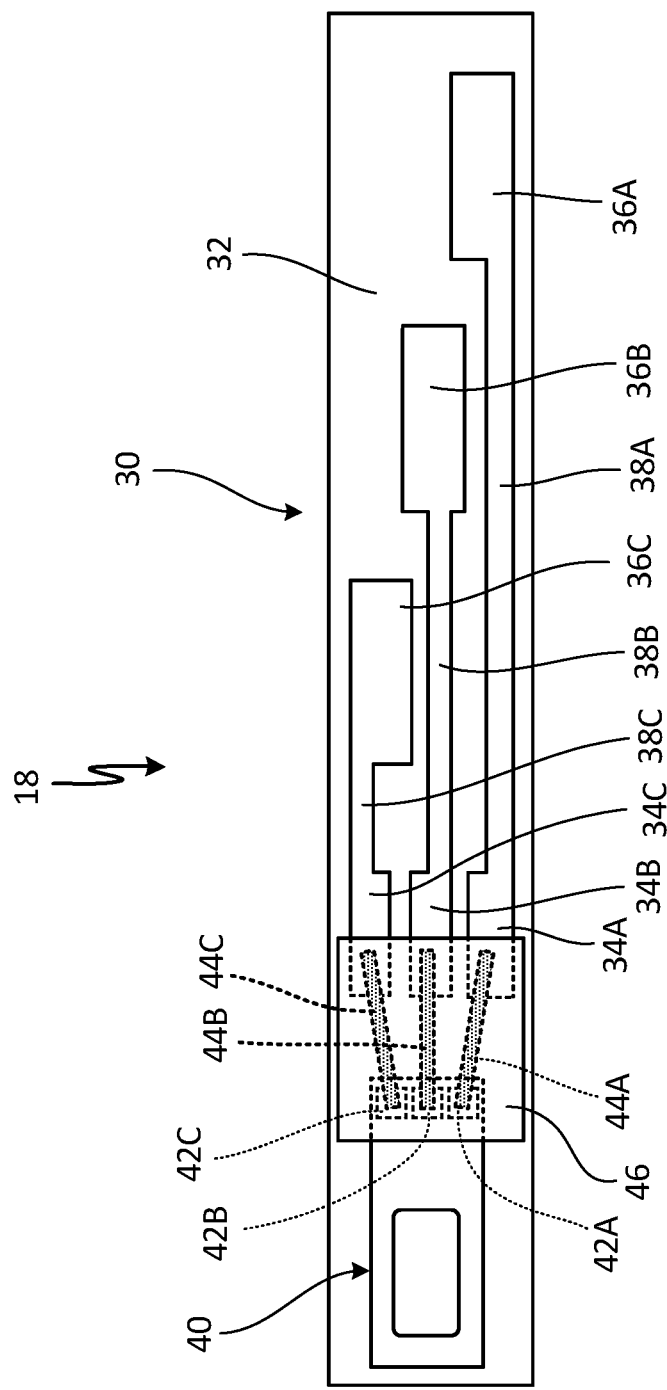
FIG. 2 is a top view of the sensor assembly.

FIG. 1 is a side view of a distal portion of guide wire 10, which includes sensor assembly 18. FIG. 2 is a top view of sensor assembly 18. FIG. 1 shows guide wire 10, shaft 12, spring tip 14, cutout 16, sensor assembly 18, and wires 20A, 20B, and 20C. FIG. 2 shows sensor assembly 18. Sensor assembly 18 includes flexible circuit 30, flexible substrate 32, input pads 34A, 34B, and 34C (shown in FIG. 2), output pads 36A, 36B, and 36C, traces 38A, 38B, and 38C (shown in FIG. 2), sensor 40, sensor pads 42A, 42B, and 42C (shown in FIG. 2), wire bonds 44A, 44B, and 44C (shown in FIG. 2), and encapsulation 46.

FIG. 1 shows a distal portion of guide wire 10, which includes shaft 12 and spring tip 14. Shaft 12 forms a main body portion of guide wire 10. Spring tip 14 is connected to shaft 12 and is positioned adjacent to a distal end of guide wire 10. Spring tip 14 of guide wire 10 can be inserted into a vessel and moved through the vessel. A proximal end of guide wire 10 remains outside the vessel and can be used to control the movement of guide wire 10 through the vessel. Cutout 16 is formed in shaft 12 near spring tip 14. Cutout 16 is an opening in guide wire 10 in which sensor assembly 18 can be positioned, as shown in FIG. 1. Wires 20A, 20B, and 20C are connected to sensor assembly 18 and extend through guide wire 10 towards the proximal end of guide wire 10. Wires 20A, 20B, and 20C can have a diameter, for example, of about 0.0012 inches (0.03048 millimeters).

Sensor assembly 18 includes flexible circuit 30. Flexible circuit 30 includes flexible substrate 32 that forms a body or support portion of sensor assembly 18. Flexible substrate 32 can be made out of a polyimide film, such as Kapton, or any other suitable flexible plastic substrate. Flexible substrate 32 can have a thickness, for example, of about 0.002 inches (0.0508 millimeters). Input pads 34A, 34B, and 34C, output pads 36A, 36B, and 36C, and traces 38A, 38B, and 38C are positioned on flexible circuit 30. Input pads 34A, 34B, and 34C are connected to output pads 36A, 36B, and 36C with traces 38A, 38B, and 38C, respectively. The embodiment shown in FIGS. 1-2 shows three input pads 34A, 34B, and 34C, output pads 36A, 36B, and 36C, and traces 38A, 38B, and 38C positioned on flexible circuit 30, but flexible circuit 30 can have any number of input pads 34A, 34B, and 34C, output pads 36A, 36B, and 36C, and traces 38A, 38B, and 38C in alternate embodiments. Input pads 34A, 34B, and 34C, output pads 36A, 36B, and 36C, and traces 38A, 38B, and 38C can be made out of a metallic material, such as copper, and provide contact points for electrical components.

Sensor 40 is positioned on flexible circuit 30. Sensor 40 may be a MEMS device. In the embodiment shown in FIGS. 1-2, sensor 40 is a pressure sensor having a size of, for example, about 0.007 inches (0.1778 millimeters) wide by 0.026 inches (0.6604 millimeters) long. In alternate embodiments, sensor 40 can be a light sensor, a gas sensor, a temperature sensor, a motion sensor, or any other suitable sensor. Sensor 40 includes sensor pads 42A, 42B, and 42C positioned on sensor 40. The embodiment shown in FIGS. 1-2 shows three sensor pads 42A, 42B, and 42C positioned on sensor 40, but sensor 40 can have any number of sensor pads 42A, 42B, and 42C in alternate embodiments. Sensor pads 42A, 42B, and 42C can be made out of a metallic material, such as aluminum, and provide contact points for electrical components.

Wire bonds 44A, 44B, and 44C extend between sensor pads 42A, 42B, and 42C on sensor 40 and input pads 34A, 34B, and 34C on flexible circuit 30, respectively. Wire bonds 44A, 44B, and 44C provide an electrical connection between sensor 40 and flexible circuit 30. In the embodiment shown in FIGS. 1-2, three wire bonds 44A, 44B, and 44C extend between sensor 40 and flexible circuit 30, connecting each sensor pad 42A, 42B, and 42C on sensor 40 with one input pad 34A, 34B, and 34C on flexible circuit 30. In an alternate embodiment, the number of wire bonds 44A, 44B, and 44C can includes any number of wire bonds 44A, 44B, and 44C to correspond to the number of sensor pads 42A, 42B, and 42C and input pads 34A, 34B, and 34C. Wire bonds 44A, 44B, and 44C are covered with encapsulation 46. Encapsulation 46 covers wire bonds 44A, 44B, and 44C to prevent wire bonds 44A, 44B, and 44C from being damaged.

Sensor pads 42A, 42B, and 42C on sensor 40 are electrically connected to input pads 34A, 34B, and 34C on flexible circuit 30 with wire bonds 44A, 44B, and 44C, respectively. Input pads 34A, 34B, and 34C are electrically connected to output pads 36A, 36B, and 36C with traces 38A, 38B, and 38C, respectively. Output pads 36A, 36B, and 36C are electrically connected to wires 20A, 20B, and 20C, respectively. Wires 20A and 20B can provide power to sensor 40 through output pads 36A and 36B, traces 38A and 38B, input pads 34A and 34B, wire bonds 44A and 44B, and sensor pads 42A and 42B, respectively. Wires 20A and 20B can also carry electrical signals from sensor 40 to a system exterior to guide wire 10 through sensor pads 42A and 42B, wire bonds 44A and 44B, input pads 34A and 34B, traces 38A and 38B, and output pads 36A and 36B, respectively. Wire 20C is a ground wire and forms a ground for sensor 40 along sensor pad 42C, wire bond 44C, input pad 34C, trace 38C, and output pad 36C.

Wires 20A, 20B, and 20C extend through guide wire 10 towards the proximal end of guide wire 10. When sensor assembly 18 is positioned in guide wire 10, electrical signals can be sent from sensor pads 42A, 42B, and 42C of sensor 40, through wire bonds 44A, 44B, and 44C, through input pads 34A, 34B, and 34C, through traces 38A, 38B, and 38C, through output pads 36A, 36B, and 36C, and through wires 20A, 20B, and 20C. Wires 20A, 20B, and 20C can be connected to a device that can receive and process the electrical signals from sensor 40. In the embodiment shown in FIGS. 1-2, sensor 40 is a pressure sensor that can sense a pressure in a vessel. Sensor assembly 18 can communicate the pressure through guide wire 10. In this manner, pressures within the vessel can be determined after guide wire 10 is positioned in the vessel.

Sensor 40 is a MEMS device with a small size. Sensor 40 is sized small in order to fit in guide wire 10. Due to the small size of sensor 40, it can be difficult to test sensor 40 and it can be difficult to handle sensor 40. Positioning sensor 40 on sensor assembly 18 allows sensor 40 to be more easily tested and handled.

Figure 3:
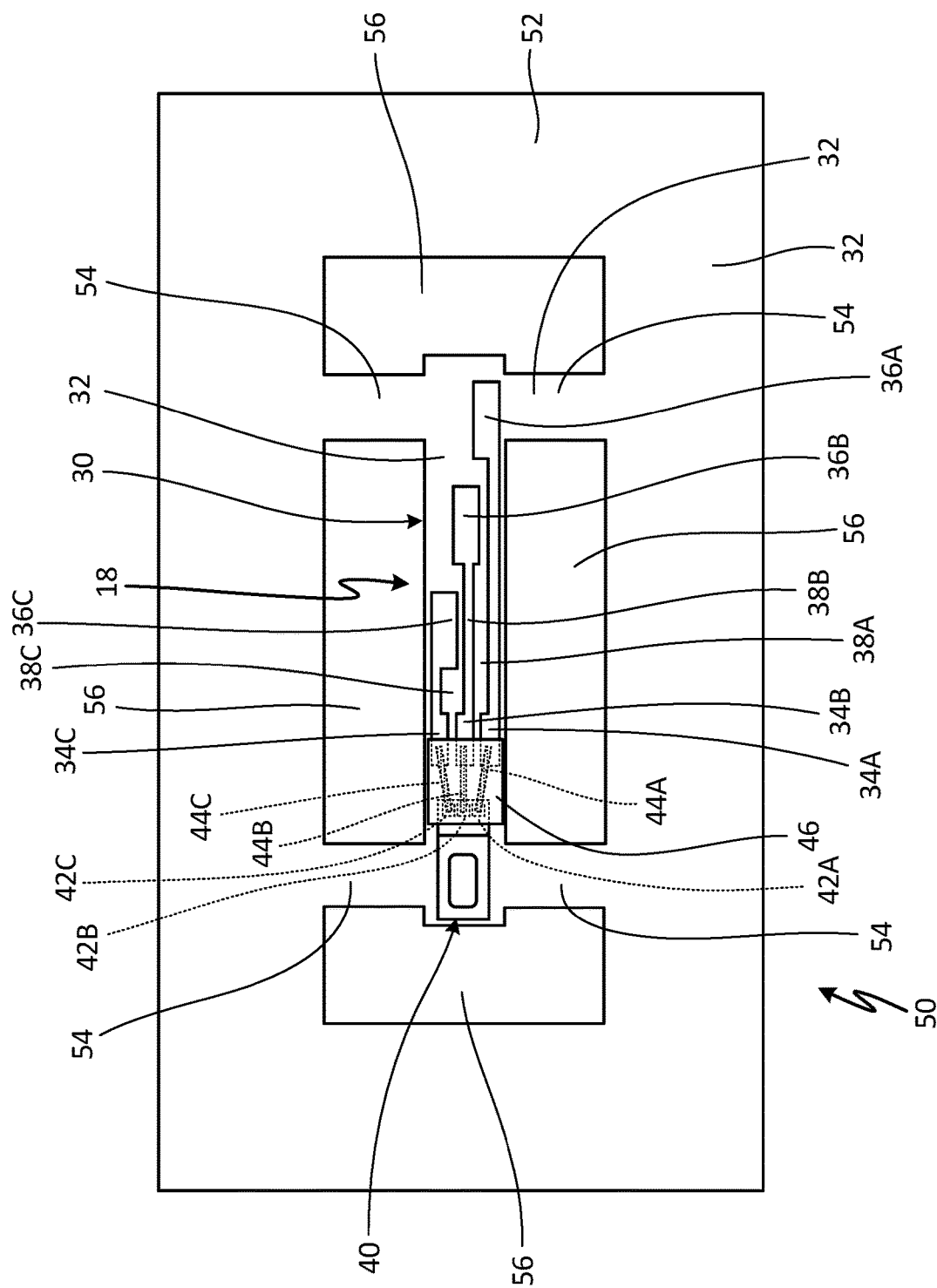
FIG. 3 is a top view of a sensor assembly die including the sensor assembly.

FIG. 3 is a top view of sensor assembly die 50 including sensor assembly 18. FIG. 3 shows sensor assembly 18, flexible circuit 30, flexible substrate 32, input pads 34A, 34B, and 34C, output pads 36A, 36B, and 36C, traces 38A, 38B, and 38C, sensor 40, sensor pads 42A, 42B, and 42C, wire bonds 44A, 44B, and 44C, encapsulation 46, sensor assembly die 50, frame 52, tabs 54, and openings 56.

Sensor assembly 18 includes flexible circuit 30. Flexible substrate 32 forms a body portion of flexible circuit 30. Input pads 34A, 34B, and 34C, output pads 36A, 36B, and 36C, and traces 38A, 38B, and 38C are positioned on flexible substrate 32 and provide contact points for electrical components. Sensor 40 is positioned on flexible circuit 30. Sensor pads 42A, 42B, and 42C are positioned on sensor 40 and provide contact points for electrical components. Sensor pads 42A, 42B, and 42C of sensor 40 are connected to input pads 34A, 34B, and 34C of flexible circuit 30 with wire bonds 44A, 44B, and 44C. Wire bonds 44A, 44B, and 44C are covered with encapsulation 46.

Sensor assembly 18 forms a part of sensor assembly die 50. Sensor assembly die 50 includes frame 52 that surrounds sensor assembly 18. Tabs 54 extend from frame 52 to sensor assembly 18 and hold sensor assembly 18 in frame 52. Frame 52, tabs 54, and flexible circuit 30 of sensor assembly 18 are an integral piece and are made out of flexible substrate 32. Openings 56 are formed between sensor assembly 18, frame 52, and tabs 54.

Sensor assembly die 50 provides a handling mechanism for sensor assembly 18. As discussed above in reference to FIGS. 1-2, sensor assembly 18 is very small and difficult to handle. Positioning frame 52 and tabs 54 around sensor assembly 18 allows sensor assembly 18 to be more easily handled. Frame 52 and tabs 54 can be sized so that it is easier to handle sensor assembly die 50. Sensor assembly 18 can be removed from sensor assembly die 50 but cutting sensor assembly 18 out of sensor assembly die along tabs 54.

Figure 4:
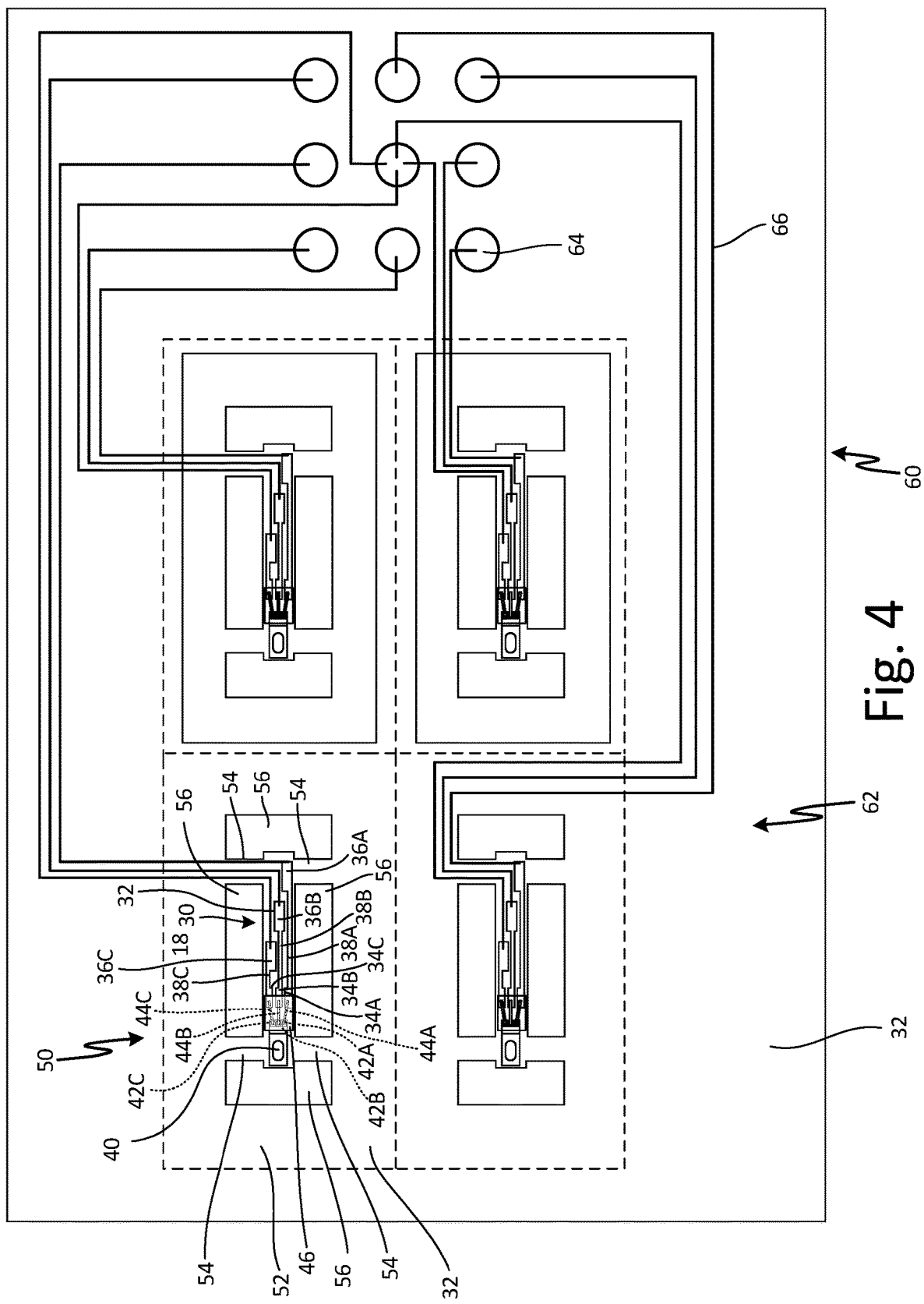
FIG. 4 is a top view of a test sheet including an array of sensor assembly dies.

FIG. 4 is a top view of test sheet 60 including array 62 of sensor assembly dies 50. FIG. 4 shows sensor assembly 18, flexible circuit 30, flexible substrate 32, input pads 34A, 34B, and 34C, output pads 36A, 36B, and 36C, traces 38A, 38B, and 38C, sensor 40, sensor pads 42A, 42B, and 42C, wire bonds 44A, 44B, and 44C, encapsulation 46, sensor assembly die 50, frame 52, tabs 54, and openings 56, test sheet 60, array 62, test pads 64, and traces 66.

Sensor assembly 18 includes flexible circuit 30. Flexible substrate 32 forms a body portion of flexible circuit 30. Input pads 34A, 34B, and 34C, output pads 36A, 36B, and 36C, and traces 38A, 38B, and 38C are positioned on flexible substrate 32 and provide contact points for electrical components. Sensor 40 is positioned on flexible circuit 30. Sensor pads 42A, 42B, and 42C are positioned on sensor 40 and provide contact points for electrical components. Sensor pads 42A, 42B, and 42C of sensor 40 are connected to input pads 34A, 34B, and 34C of flexible circuit 30 with wire bonds 44A, 44B, and 44C. Wire bonds 44A, 44B, and 44C are covered with encapsulation 46.

Sensor assembly die 50 includes frame 52 that surrounds sensor assembly 18. Tabs 54 extend between frame 52 and sensor assembly 18. Frame 52, tabs 54, and flexible circuit 30 of sensor assembly 18 are an integral piece and are made out of flexible substrate 32. Openings 56 are formed between sensor assembly 18, frame 52, and tabs 54.

Test sheet 60 includes array 62 of sensor assembly dies 50 on a first side of test sheet 60. In the embodiment shown in FIG. 4, array 62 includes four sensor assembly dies 50, but array 62 can include any number of sensor assembly dies 50 in alternate embodiments. Sensor assembly dies 50 that form array 62 are an integral piece and are made out of flexible substrate 32. Further, array 62 and test sheet 60 can be an integral piece that is made out of flexible substrate 32. Positioned on a second side of test sheet 60 opposite array 62 are test pads 64. Test pads 64 can be made out of a metallic material, such as copper, and provide contact points for electrical components.

Traces 66 extend from output pads 36A, 36B, and 36C of flexible circuit 30 to test pads 64. Traces 66 can be made out a metallic material, such as copper, and electrically connect output pads 36A, 36B, and 36C of flexible circuit 30 with test pads 64. As seen in the embodiment shown in FIG. 4, each sensor assembly 18 has three output pads 36A, 36B, and 36C. One trace 66 extends from each output pads 36A, 36B, and 36C for each sensor assembly 18. Output pads 36A and 36B of each sensor assembly 18 are connected to individual test pads 64 with traces 66. Output pads 36C of each sensor assembly 18 are connected a common test pad 64 with traces 66. The common test pad 64 represents a ground test pad. In alternate embodiments, flexible circuit 30 can include any suitable number of output pads 36A, 36B, and 36C and traces 66 can extend from output pads 36A, 36B, and 36C of flexible circuit 30 to test pads 64 in any suitable manner.

Test sheet 60 can be manufactured as a single piece out of flexible substrate 32. When test sheet 60 is manufactured, it will not include sensors 40, wire bonds 44A, 44B, and 44C, or encapsulation 46. Sensors 40 can be positioned on each sensor assembly 18 on test sheet 60. Wire bonds 44A, 44B, and 44C can then be positioned to connect sensor pads 42A, 42B, and 42C on each sensor 40 with inputs pads 34A, 34B, and 34C on one flexible circuit 30, respectively. Test sheet 60 can be designed and manufactured to include any suitable number of sensor assemblies 18, any suitable number of test pads 64, and any suitable number of traces 66.

Test sheet 60 allows for a number of sensors 40 to be handled at one time. Sensors 40 can be positioned on test sheet 60 with a first machine, and then test sheet 60 can be moved to a second machine to add wire bonds 44A, 44B, and 44C. Positioning a number of sensors 40 on test sheet 60 allows numerous sensors 40 to be positioned with the first machine prior to moving it to the second machine, versus having to move each individual sensor assembly 18. This can reduce the time, cost, and labor needed to manufacture sensor assemblies 18.

Figure 5:
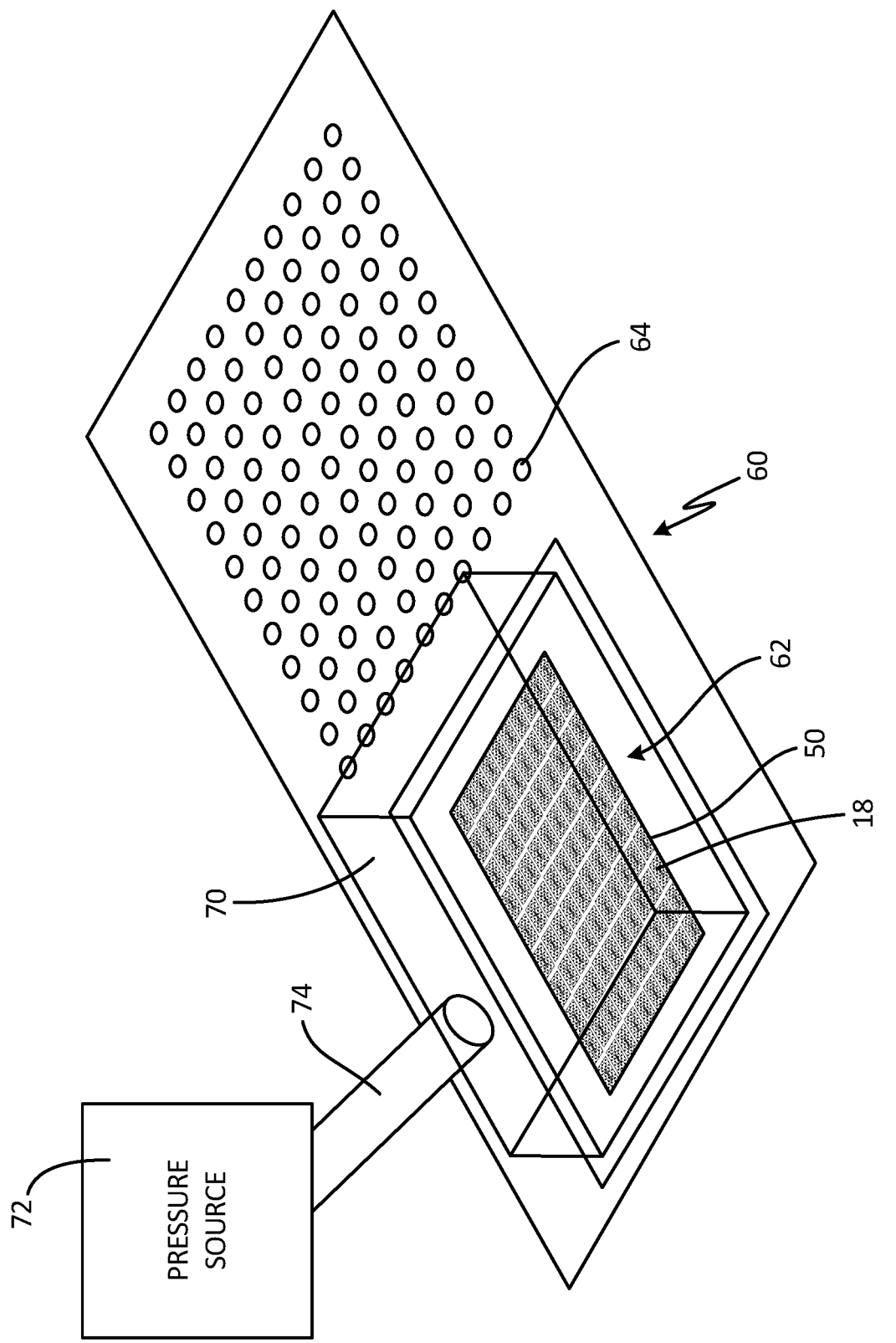
FIG. 5 is a perspective view of the test sheet including an enclosure.

FIG. 5 is a perspective view of test sheet 60 including enclosure 70. FIG. 5 shows sensor assemblies 18, sensor assembly dies 50, test sheet 60, array 62, test pads 64, enclosure 70, pressure source 72, and tube 74.

Sensor assemblies 18 are each held in a sensor assembly die 50. Test sheet 60 includes array 62 of sensor assembly dies 50 on a first side of test sheet 60. In the embodiment shown in FIG. 5, array 62 includes one hundred sensor assembly dies 50, but array 62 can include any number of sensor assembly dies 50 in alternate embodiments. Test pads 64 are formed on a second side of test sheet 60. Traces 66 (not shown in FIG. 5 for clarity) extend from sensor assemblies 18 to test pads 64 and form an electrical connection between sensor assemblies 18 and test pads 64.

Enclosure 70 is formed over array 62 of sensor assembly dies 50. Enclosure 70 seals against test sheet 60. In the embodiment shown in FIG. 5, sensor 40 (not shown in FIG. 5) on sensor assembly 18 is a pressure sensor. Pressure source 72 is connected to enclosure 70 with tube 74. Pressure source 72 can pressurize the space inside enclosure 70. Each sensor assembly 18 in array 62 can then detect the pressure and communicate an electrical signal from sensor assembly 18 along traces 66 to test pads 64. The electrical signal can be read at test pads 64 as either voltage or current. In alternate embodiments, the space inside enclosure 70 can be heated or cooled to sense temperate, a fluid can be flowed through the space inside enclosure 70 to sense motion, a gas can fill the space inside enclosure 70 to sense gas, or a light can fill the space inside enclosure 70 to sense light.

After sensors 40 have been tested, sensor assembly dies 50 can be singulated from array 62 of test sheet 60. Sensor assembly dies 50 can then be further cut along tabs 54 so that sensor assemblies 18 can be removed from sensor assembly dies 50. Each sensor assembly 18 can then be positioned in a guide wire, as shown in FIG. 1.

Test sheet 60 allows a number of sensors 40 to be tested at one time. This reduces the time, cost, and labor needed to test sensors 40. Instead of forming an enclosure over one sensor 40 to test it, enclosure 70 can be formed over a number of sensors 40 to test numerous sensors 40 at one time. After the sensors 40 have been tested, sensor assemblies 18 can be singulated from test sheet 60. Test sheet 60 allows a number of sensors assemblies 18 to be handled and tested at the same time.

Discussion of Possible Embodiments

The following are non-exclusive descriptions of possible embodiments of the present invention.

A method of testing sensors includes providing a test sheet that includes a plurality of sensor assemblies, a plurality of test pads, and traces extending from the sensor assemblies to the plurality of test pads. A sensor is positioned on each sensor assembly. Each sensor is connected to the sensor assembly with wire bonds. An enclosure is formed over the plurality of sensor assemblies. An electrical signal is detected from each of the plurality of sensor assemblies at the test pads.

The method of the preceding paragraph can optionally include, additionally and/or alternatively, any one or more of the following features, configurations and/or additional components:

The wire bonds are encapsulated.

The plurality of sensor assemblies are separated from one another.

Wherein a plurality of sensor assembly dies each hold one sensor assembly.

Each sensor assembly is separated from the sensor assembly die it is held in.

Wherein the plurality of sensor assembly dies are positioned in an array on the test sheet.

Wherein the enclosure is formed over the array of sensor assembly dies.

Wherein the sensors are MEMS devices.

Wherein the sensors are selected from the group consisting of pressure sensors, light sensors, gas sensors, motion sensors, temperature sensors, or combinations thereof.

Wherein the sensor is a pressure sensor and an interior of the enclosure over the assemblies is pressurized with a pressure source.

A sensor assembly includes a flexible circuit and a sensor positioned on the flexible circuit. The flexible circuit includes a flexible substrate that forms a body portion of the sensor assembly and pads positioned on the flexible circuit. Wire bonds connect the sensor to the pads on the flexible circuit.

The sensor assembly of the preceding paragraph can optionally include, additionally and/or alternatively, any one or more of the following features, configurations and/or additional components:

Wherein the pads on the flexible circuit each include an input pad, an output pad, and a trace connecting the input pad to the output pad, wherein the sensor includes sensors pads, and wherein the wire bonds connect the sensor pads on the sensor to the input pads on the flexible circuit.

Wherein the sensor is a MEMS device.

An encapsulation is formed over the wire bonds.

Wherein the flexible circuit is made out of a polyimide film.

A test sheet includes an array of sensor assembly dies, a plurality of test pads, and a plurality of electrical traces. Each sensor assembly die includes a sensor assembly, a frame surrounding the sensor assembly, and a plurality of tabs connecting the sensor assembly to the frame. Each electrical trace connects a sensor assembly to one test pad.

The test sheet of the preceding paragraph can optionally include, additionally and/or alternatively, any one or more of the following features, configurations and/or additional components:

Wherein the array of sensor assembly dies is formed as an integral piece made out of a flexible substrate.

Wherein the sensor assembly includes a flexible circuit that includes a flexible substrate that forms a body portion of the sensor assembly and pads positioned on the flexible circuit; a sensor positioned on the flexible circuit; and wire bonds connecting the sensor to the pads on the flexible circuit.

Wherein the sensor is a MEMS device.

Wherein the flexible substrate of the sensor assembly and the frame and tabs of the sensor assembly die are formed out of a polyimide film.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A sensor assembly die comprising:
   a sensor assembly, the sensor assembly comprising:
      a flexible circuit that includes a flexible substrate that forms a body portion of the sensor assembly and pads positioned on the flexible circuit;
      a sensor positioned on the flexible circuit; and
      wire bonds connecting the sensor to the pads on the flexible circuit;
   a frame surrounding the sensor assembly; and
   a plurality of tabs connecting the sensor assembly to the frame, wherein each of the plurality of tabs is configured to be cut to allow the sensor assembly to be removed from the frame;
   wherein the frame and the plurality of tabs are integrally formed with the flexible circuit.

2. The sensor assembly die of claim 1, wherein the pads on the flexible circuit each include an input pad, an output pad, and a trace connecting the input pad to the output pad, wherein the sensor includes sensors pads, and wherein the wire bonds connect the sensor pads on the sensor to the input pads on the flexible circuit.

3. The sensor assembly die of claim 1, wherein the sensor is a MEMS device.

4. The sensor assembly die of claim 1, and further comprising:
   encapsulation formed over the wire bonds.

5. The sensor assembly die of claim 1, wherein the flexible circuit is made out of a polyimide film.

6. A test sheet comprising:
   an array of sensor assembly dies, wherein each sensor assembly die comprises:
      a sensor assembly;
      a frame surrounding the sensor assembly; and
      a plurality of tabs connecting the sensor assembly to the frame, wherein each of the plurality of tabs is configured to be cut to allow the sensor assembly to be removed from the frame;
      wherein the frame and the plurality of tabs are integrally formed with the array of sensor assembly dies;
   a plurality of test pads; and
   a plurality of electrical traces, wherein each electrical trace connects the sensor assembly to one test pad.

7. The test sheet of claim 6, wherein the array of sensor assembly dies is formed as an integral piece made out of a flexible substrate.

8. The test sheet of claim 6, wherein the sensor assembly comprises:
   a flexible circuit that includes a flexible substrate that forms a body portion of the sensor assembly and pads positioned on the flexible circuit;
   a sensor positioned on the flexible circuit; and
   wire bonds connecting the sensor to the pads on the flexible circuit.

9. The test sheet of claim 8, wherein the sensor is a MEMS device.

10. The test sheet of claim 8, wherein the flexible substrate of the sensor assembly and the frame and the plurality of tabs of the sensor assembly die are formed out of a polyimide film.

* * * * *